United States Patent [19]

Qualich

[11] Patent Number: 4,896,245
[45] Date of Patent: Jan. 23, 1990

[54] FET OVERTEMPERATURE PROTECTION CIRCUIT

[75] Inventor: John Qualich, Wheeling, Ill.

[73] Assignee: Motorola Inc., Schaumburg, Ill.

[21] Appl. No.: 322,015

[22] Filed: Mar. 13, 1989

[51] Int. Cl.$^4$ .............................................. H02H 3/26
[52] U.S. Cl. ...................................................... 61/103
[58] Field of Search ..................... 361/87, 93, 98, 100, 361/101, 103; 330/207 P, 298; 307/296.5

[56] References Cited

U.S. PATENT DOCUMENTS 4,595,966  6/1986  Huser et al. ........................ 361/98 X
4,771,357  9/1988  Lorinez et al. ..................... 361/98 X

OTHER PUBLICATIONS

Motorola Power MOSFET Tansistor Data Book, Third Edition, 1988, pp. 3-717 to 3-723.

*Primary Examiner*—Derek S. Jennings
*Attorney, Agent, or Firm*—Phillip H. Melamed

[57] ABSTRACT

A first signal ($V_1$) related to FET drain to source voltage and a second signal ($V_2$) related to FET source current are compared and the FET (11) is turned off when the first signal exceeds the second signal by a predetermined amount. This corresponds to turning the FET off whe the drain to source on resistance of the FET exceeds a FET on resistance value corresponding to a maximum allowable FET die temperature. Thus the FET is turned off for excessive due temperatures to prevent damage to the FET. A start-up circuit (41, 42) is provided to insure proper initial turning on of the FET, and a short circuit protection circuit (30) is provided for turning the FET off it the source current exceeds some maximum current limit. Accurate, effective monitoring of the FET die temperature is provided without the use of an additional temperature sensing element provided adjacent the FET.

21 Claims, 1 Drawing Sheet

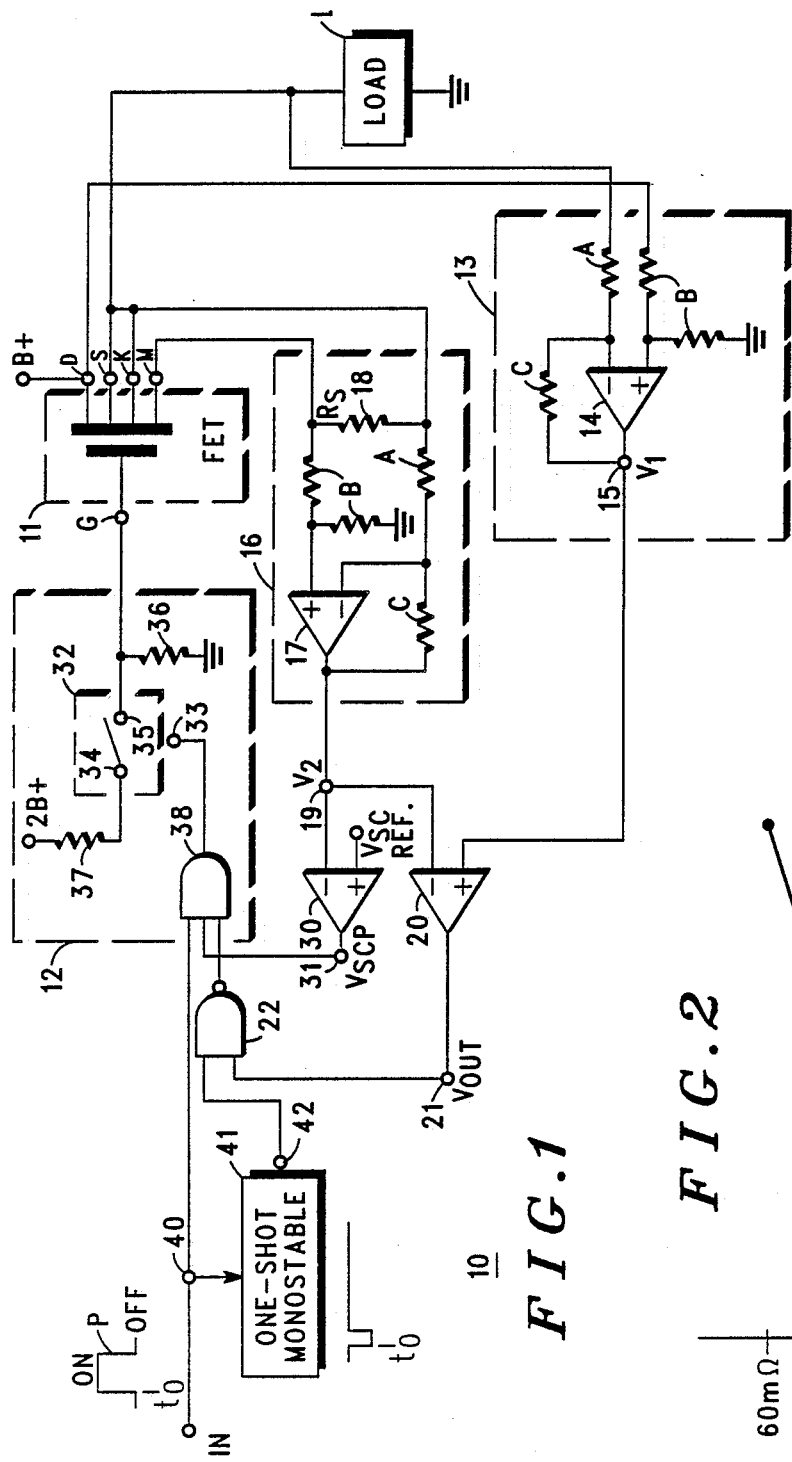

FET OVERTEMPERATURE PROTECTION CIRCUIT

BACKGROUND OF THE INVENTION

The present invention is related to the field of temperature protection circuits for transistors. The present invention is particularly useful for field effect transistors (FETS), and may also be usable for other transistors.

It is known that if an FET die exceeds some predetermined operating temperature while the FET is on, there is a substantial likelihood of failure of or damage to the FET. Thus, FETS have published specifications which indicate the maximum allowable operating junction temperature for the transistor. Failures are caused by exceeding the maximum allowable junction temperature, and failures also can occur because excessive short circuit current is passed through the die.

Some prior systems have provided overtemperature protection for the transistor by providing an additional temperature sensing element, comprising a diode or thermistor, as close as possible to the FET die to sense FET temperature. Then the FET is turned off when the sensed temperature exceeds some maximum threshold. In such prior systems, typically there may be poor thermal coupling between the temperature sensing element and the FET die so that the actual sensed temperature is not accurately representative of the actual FET temperature. Thus, circuit designers might have to provide an additional safety margin by insuring that the FET turns off even though the maximum actual FET die temperature may not yet have been reached. While this will save the FET device, it interrupts desired normal circuit operation prematurely. In addition, the providing of an additional temperature sensing element very close to the FET die complicates and increases the cost of the resultant mechanical structure which would now include the FET and the sensing element.

Other prior systems have attempted to monitor either FET voltage or FET through current and shut off the FET when these exceeded some predetermined threshold. However, these techniques do not accurately turn off the transistor in accordance with the actual FET die temperature since the FET drain to source voltage and through current are not only functions of the FET die temperature, but are also primary functions of the load connected to the FET. Some transistor foldback circuits receive signals related to both collector to emitter voltage and emitter current and reduce transistor power when both these signals together indicate excessive transistor power dissipation. However, such circuits do not effectively monitor actual die temperature and can prematurely interrupt normal transistor operation before the maximum allowable die temperature is reached.

While some prior systems which utilize an additional temperature sensing element may function fairly well in accurately sensing FET die temperature, these systems still increase the cost and complexity of the mechanical package of the combined FET and temperature sensing element. Without using an additional temperature sensing element, the prior art has not provided an accurate temperature protection circuit which shuts the FET off as a function of actual FET die temperature.

SUMMARY OF THE INVENTION

An object of the present invention is to provide an improved transistor overtemperature protection circuit which overcomes the above-mentioned deficiencies.

A more particular object of the present invention is to provide an improved overtemperature protection circuit which accurately monitors transistor die temperature without the use of an additional temperature sensing element.

In one embodiment of the present invention a transistor overtemperature protection circuit is provided. This circuit comprises: a transistor having at least a control electrode and two separate main current conduction electrodes the current therethrough dependent on signals at the control electrode, one of the current conduction electrodes intended for connection to a load so that the transistor can selectively control current supplied to the load; a drive excitation circuit for providing excitation to the transistor to selectively control conduction of the transistor in accordance with received control signals; a first circuit coupled to the transistor for developing a first signal indicative of and varying in accordance with the voltage between the transistor current conduction electrodes; a second circuit coupled to the transistor for developing a second signal indicative of and varying in accordance with the current flowing through one of the transistor current conduction electrodes when tuhe transistor is on; a combining circuit coupled to the first and second circuits for receiving the first and second signals, and combining them to provide an output signal in response thereto when a predetermined relationship exists between the first and second signals which indicates the transistor on resistance between the current conduction electrodes exceeds a predetermined value, and a coupling circuit for providing the output signal as at least one of the control input signals received by the drive excitation circuit, the excitation circuit responding to the output signal by reducing the transistor current through the current conduction electrodes when the predetermined relationship between the first and second signals exists.

Essentially, the present invention utilizes the fact that the on resistance of a transistor, preferably a FET, is a function of die temperature and is not a substantial function of any load connected to the transistor. Thus, the present invention utilizes this relationship to effectively monitor FET die temperature and reduce FET current when the die temperature exceeds a predetermined maximum limit. Preferably, two separate signals are provided, one related to the voltage across the drain and source electrodes of the FET and one related to the FET through current essentially comprising the current passing from the drain electrode through the FET to the source electrode. These signals are then amplified by predetermined gain factors and compared to each other. When one of these amplified signals exceeds the other, this is indicative of the actual FET drain to source on resistance exceeding a predetermined value and this directly correlates to the FET die temperature exceeding a predetermined maximum temperature. In response to this maximum die temperature being exceeded, the FET is preferably turned off and thus damage to the FET is prevented. In addition, preferably the present invention may also utilize a short circuit load protection circuit to similarly turn off the FET if the FET through current exceeds some predetermined maximum current. While the present invention is described in the context of a FET overtemperature protection circuit, it may also be usable for other transistors, such as bipolar transistors.

The above aspects of the present invention, as well as additional aspects and advantages of the present invention, are more fully explained in connection with the subsequent more detailed description of the preferred embodiments of the present invention.

BRIEF DESCRIPTION OF THE DRAWINGS

For a more complete understanding of the invention, reference should be made to the drawings in which:

FIG. 1 is a schematic diagram of a FET overtemperature protection circuit constructed in accordance with the present invention; and FIG. 2 is a graph illustrating the relationship between FET drain to source on resistance and FET die temperature.

DESCRIPTION OF THE PREFERRED EMBODIMENT

Referring to FIG. 1, a FET overtemperature protection circuit 10 is illustrated. The protection circuit includes a FET 11 (shown dashed) having gate (G), source (S), and drain (D) electrodes, with the source electrode connected to a load L to permit the FET to selectively supply FET through current to the load. The term "FET through current" is utilized herein to denote the current passed through the main current conducting electrodes comprising the drain and source electrodes. Preferably the FET 11 comprises a Motorola, Inc. MTP40N06M TMOS Power MOSFET having current sensing capability designed therein. Thus, the FET 11 also has a mirror (M) electrode and a Kelvin (K) electrode as shown.

The on/off operation of the FET 11 is determined by a drive excitation circuit 12 (shown dashed) which provides gate excitation to the FET gate electrode to selectively turn the FET on and off in accordance with received control signals. In response to the junction (die) temperature of the FET 11 exceeding some predetermined maximum limit when the FET is on, the protection circuit 10 will turn the FET off. This is generally accomplished in the following manner.

A first circuit 13 (shown dashed) essentially comprises a differential amplifier 14 which has one input connected to the FET source electrode and another input connected to the FET drain electrode. At an output terminal 15 of the differential amplifier 14 a first analog signal $V_1$ is provided which is indicative of and has an amplitude which varies in accordance with the voltage that exists between the FET drain and source electrodes wherein this voltage is conventionally referred to as $V_{DS}$.

A second circuit 16 (shown dashed) includes a similar differential amplifier 17 which has one input connected to the FET mirror electrode M and another input connected to the FET Kelvin electrode K. In addition, the second circuit 16 has a sensing resistor 18 ($R_S$) connected between the electrodes M and K so as to develop a voltage thereacross which is related to the FET source current (through current) which is provided to the load L. The differential amplifier 17 develops at an output terminal 19 a second analog signal V2 which is indicative of and has an a amplitude which varies in accordance with the current flowing through the FET source electrode when the FET is on. Essentially, FET mirror current which passes through the sense resistor 18 is a fixed very small predetermined percentage of the source current passing through the source electrode S. Therefore the voltage developed across the resistor 18 is indicative of the FET source current so that the signal V2 is therefore also indicative of source current. The configuration of the FET 11, the current sensing resistor 18 and the load L is conventional with regard to current sensing FET devices.

According to the preferred embodiment of the invention, the analog voltage V1 related to the drain to source FET voltage is provided as one input to a voltage comparator circuit 20 which receives another input comprising the analog voltage V2 indicative of FET source current. The comparator circuit 20 effectively combines these signals and provides, at an output terminal 21, a digital output signal $V_{OUT}$ in response thereto when the signal V1 exceeds the signal V2 by a predetermined threshold which corresponds to the inherent switching threshold of the comparator 20 which may be 0. The comparator 20 actually compares the magnitudes (amplitudes) of the analog signals V1 and V2 and, as a result of this comparison, provides the digital signal $V_{OUT}$ as a positive (high) logic state when the amplitude of V1 is greater than V2. This, as will be shown subsequently, is indicative of the FET die temperature exceeding some predetermined maximum die temperature limit. The high logic signal $V_{OUT}$ at the terminal 21 is then coupled, via a NAND gate 22, as at least one control input signal provided to the drive excitation circuit 12 so as to turn off the FET when the FET die temperature maximum limit has been exceeded.

The above-described operation of the circuit 10 can better be understood by now referring to FIG. 2 which is a graph of the drain to source on resistance, $R_{DS}$(on), of the FET 11 as a function of the die (junction) temperature, $T_J$, of the FET 11. FIG. 2 indicates that for a die temperature of 25 degrees C. (centigrade) a drain to source on resistance of 30 milliohms exists while for a temperature of 150 degrees C. a resistance of 60 milliohms exists. The protection circuit 10 utilizes the fact that the drain to source on resistance varies directly as a function of die temperature to provide an accurate protection circuit for the FET 11 without utilizing any additional temperature sensing element positioned adjacent to the FET. It should be noted that the drain to source on resistance shown in FIG. 2 does not vary substantially as a function of current drawn by the load L and this enables the circuit 10 to accurately shut off the FET when a maximum die temperature has been reached.

The general drain to source on resistance versus junction temperature characteristic shown in FIG. 2 is typical for any particular type of FET. Thus, the circuit 10 proposes to utilize the fact that by effectively monitoring FET drain to source resistance, you can also effectively monitor the FET junction temperature. Thus, when the drain to source resistance exceeds some predetermined drain to source resistance that exists at the maximum junction temperature to be permitted, this is indicative of when the FET should be turned off. Reference to the following three equations demonstrates the basic operation of the protection circuit 10.

$$R_{DS}(on) \cong R_{DS}(150 \text{ degrees C.}) \quad (1)$$

$$R_{DS}(on) = V_{DS}/I_S \quad (2)$$

-continued
$$V_{DS} \geq (I_S) \cdot (R_{DS} (150 \text{ degrees C.})) \quad (3)$$

Equation 1 indicates that when the actual drain to source on resistance $R_{DS}$ (on) exceeds or equals the value of the maximum drain to source on resistance at 150 degrees C. (corresponding to just above the assumed maximum permissible junction temperature), then action should be taken to turn off the FET 11. Equation 2 merely represents the known relationship that the drain to source on resistance is actually the drain to source voltage $V_{DS}$ divided by the source current $I_S$. Note that the source current is substantially identical to the drain current for the FET. Equation 3 results from the substitution of equation 2 into equation 1 and indicates that when the drain to source voltage equals or exceeds the source current times a known constant, corresponding to the drain to source on resistance at 150 degrees C, then the FET 11 should be turned off.

The circuit 10 essentially implements equation 3 by selectively adjusting the gains of the differential amplifiers in the first and second circuits 13 and 16 so as to provide the predetermined desired relationship between the signals V1 and V2 which are compared by the comparator 20. The signals V1 and V2, it should be remembered, correspond to $V_{DS}$ and $I_S$, respectively. Each of the differential amplifiers 14 and 17 in FIG. 1 includes a buffer resistor A, a pair of voltage divider input resistors B and a negative feedback gain stability resistor C. Adjustment of these resistors can implement any desired gain for the differential amplifier and therefore readily implement the relationship in equation 3 above for the signals V1 and V2 to be compared by the comparator 20.

Note that essentially all of the mirror current from the FET 11 passes through the current sensing resistor 18 since the resistors A and B in circuit 16 are of sufficient impedance to prevent such current from flowing into the differential amplifier 17. This insures that the voltage across resistor 18 is related to $I_S$ and does not depend on the input resistance of amplifier 17.

Also note that preferably the protection circuit 10 also includes a short circuit load protection circuit for turning off the FET 11 when the source current exceeds some predetermined maximum current limit. This is accomplished as follows.

The analog signal V2 at terminal 19 is related to sensed source current. This signal is received as an input by a comparator circuit 20 which also receives as an input a short circuit reference voltage $V_{SCREF}$. The output of the comparator 30 is provided at a terminal 31 and comprises a signal $V_{SCP}$ which has a negative (low) logic state when the signal V2 exceeds $V_{SCREF}$ indicating that excessive FET source current exists. The terminal 31 is connected to the gate drive excitation circuit 12 to provide the signal $V_{SCP}$ as a FET control input signal.

The drive excitation circuit 12 includes a controllable switch 32 which has a control terminal 33. In response to a high logic state at the terminal 33 a short circuit is provided by switch 32 between terminals 34 and 35, whereas for a low logic state at terminal 33 an open circuit is provided. A resistor 36 is provided between the terminal 35 and ground, and a resistor 37 is provided between the terminal 34 and a positive power supply voltage of 2B+. Half of this voltage (B+) is provided at a terminal which is directly connected to the drain electrode of the FET 11. In this manner, when the switch 32 is closed, a sufficiently high gate voltage is provided to turn the FET 11 on, and when the switch 32 is open the FET 11 is turned off. The switch 32 can be a transistor or a relay.

The drive excitation circuit 12 includes an AND gate 38 whose output is directly connected to the terminal 33. The terminal 31 is directly connected as an input to the AND gate and so is the output of the NAND gate 22. In addition, a control input terminal 40 is provided as an input to the AND gate 38. At the terminal 40 a primary control signal P is provided. For a high logic state of the signal P an on condition of the FET 11 is desired and for a low logic state an off condition is desired. Of course, these desired FET conditions will be overridden by circuit 10 if excessive FET die temperature or source current occurs. The terminal 40 is also connected as an input to a monostable one shot circuit 41 which is part of a start up circuit for the protection circuit 10. In response to an off to on transition of the signal P at a time $t_o$, the one shot circuit 41 will produce a low logic state for a short predetermined duration of time at its output terminal 42 which is connected as an input to the NAND gate 22. This results in preventing the signal $V_{OUT}$ from turning off the FET 11 during the initial turning on of the FET 11 by the control signal P. This is because until the FET source current is allowed to flow, the signal V1 will be greater than the signal V2, and thus the signal $V_{OUT}$ would tend to turn off the FET 11. To avoid this occurrence from preventing the FET 11 from ever being turned on, the start up circuit, comprising the one shot circuit 41, has been provided.

Note that the temperature protection circuit 10 effectively implements equation 3 above by comparing the amplitude of the analog signal V1 with the amplitude of the analog signal V2 and turning off the FET 11 when the signal V1 exceeds V2. This essentially implements equation 3 above and results in effectively turning off the FET 11 when the drain to source on resistance of the FET exceeds some maximum drain to source on resistance value corresponding to the occurrence of a maximum permissible junction temperature. However, it is also possible to utilize a microprocessor so as to effectively divide signals related to the drain to source voltage and source current and thereby obtain a signal having an amplitude directly related to the drain to source on resistance. This signal amplitude would then directly be compared with a fixed threshold level corresponding to the drain to source on resistance which exists at the maximum permissible junction temperature. In response to this comparison, then the FET 11 would be turned off. This latter embodiment would merely utilize a microprocessor to first effectively implement equation number 2 above and then equation number 1. Regardless of whether the protection circuit implements equation 3 or equations 2 and 1, a combining circuit would receive separate signals related to drain to source voltage and source current and turn off the FET when a predetermined relationship exists between these signals.

While I have shown and described specific embodiments of the present invention, many other modifications will occur to those of skill in the art. One such modification could comprise just reducing FET current, while keeping the FET on, if overtemperature or overcurrent conditions exist rather than turning the FET off and thereby reducing FET current. All such modifications which retain the basic underlying principals disclosed and claimed herein are within the scope of this invention.

I claim:

1. A FET overtemperature protection circuit comprising:
   a FET having at least gate, source and drain electrodes, one of the drain and source electrodes intended for connection to a load so that the FET can selectively control current supplied to the load;
   drive excitation circuit means for providing excitation to the FET to selectively control conduction of the FET in accordance with received control signals;
   first circuit means coupled to the FET for developing a first signal indicative of and varying in accordance with the voltage between the FET drain and source electrodes;
   second circuit means coupled to the FET for developing a second signal indicative of and varying in accordance with current flowing through one of said FET drain and source electrodes when said FET is on;
   combining circuit means coupled to the first and second circuit means for receiving the first and second signals and combining them to provide an output signal in response thereto when a predetermined relationship exists between the first and second signals indicative of FET drain to source on resistance exceeding a predetermined value; and
   coupling means for providing said output signal as at least one of the control input signals received by said drive excitation circuit means, said drive excitation means including means for responding to said output signal by reducing said FET current when said predetermined relationship exsits.

2. A protection circuit according to claim 1 wherein said combining circuit means comprises a comparator which provides said output signal when said first signal has a magnitude which exceeds the magnitude of said second signal by a predetermined amount.

3. A protection circuit according to claim 1 which includes short circuit protection means coupled to said FET for providing a short circuit control signal to said driver excitation circuit means for reducing the FET current when FET current exceeds some predetermined threshold.

4. A protection circuit according to claim 3 wherein said short circuit protection means includes a comparator which receives the second signal, compares it to a predetermined threshold and provides the short circuit control signal in response to this comparison.

5. A protection circuit according to claim 1 wherein said first and second circuit means each comprise differential amplifier circuits.

6. A protection circuit according to claim 1 wherein said FET comprises a current sensing FET having at least gate, drain, source and current mirror electrodes.

7. A protection circuit according to claim 6 wherein said FET also includes a Kelvin electrode, and wherein the protection circuit includes a current sensing resistor connected between the mirror and Kelvin electrodes with the Kelvin electrode directly connected to the FET source electrode.

8. A protection circuit according to claim 7 wherein said second circuit means includes a differential amplifier connected across said current sensing resistor means to provide said second signal.

9. A protection circuit according to claim 1 wherein said second circuit means includes a current sensing resistor coupled to said FET for receiving current from said FET and developing thereacross a voltage related to the current flowing through said one of said FET drain and source electrodes when said FET is on.

10. A protection circuit according to claim 9 wherein a differential amplifier circuit is connected across said FET, the output of said differential amplifier circuit corresponding to said second signal.

11. A protection circuit according to claim 10 wherein said first circuit means comprises a differential amplifier circuit having one input coupled to the source electrode of said FET and another input connected to the drain electrode of said FET, said differential amplifier providing providing at an output terminal said first signal.

12. A protection circuit according to claim 11 wherein the outputs of the differential amplifiers in said first and second means are coupled as inputs to a comparator circuit included in said combining circuit means which provides at the output of this comparator said output signal.

13. A protection circuit according to claim 1 which includes start up circuit means coupled to said drive excitation circuit means for providing a start up signal for preventing said output signal from reducing said FET current for a predetermined time after the FET is initially turned on by a control signal received by said drive excitation circuit means.

14. A protection circuit according to claim 13 which includes short circuit protection means coupled to said FET for providing a short circuit control signal to said driver excitation circuit means for reducing the FET current when FET current exceeds some predetermined threshold.

15. A protection circuit according to claim 14 wherein said drive excitation circuit means includes a gate circuit means having said short circuit and output signals coupled as inputs thereto and providing a single output in response thereto for control of said FET.

16. A protection circuit according to claim 1 wherein said drive circuit means includes for turning said FET off in response to said one of said control signals provided by said coupling means.

17. A FET overtemperature protection circuit comprising:
   a FET having at least gate, source and drain electrodes;
   a load, one of the FET drain and source electrodes connected to said load for the FET selectively supplying FET through current to the load;
   drive excitation circuit means for providing excitation to the FET to selectively control conduction of the FET in accordance with received control signals;
   first circuit means coupled to the FET for developing a first signal indicative of and varying in accordance with the voltage between the FET drain and source electrodes;
   second circuit means coupled to the FET for developing a second signal indicaative of and varying in accordance with current flowing through one of said FET drain and source electrodes when said FET is on;
   combining circuit means coupled to the first and second circuit means for receiving the first and second signals and combining them to provide an output signal in response thereto when a predetermined relationship exists between the first and second signals indicative of FET drain to source on resistance exceeding a predetermined value; and coupling means for providing said output signal as at least one of the control input signals received by said drive excitation circuit means, said drive excitation means including means for responding to said output signal by reducing said FET current when said predetermined relationship exists.

18. A protection circuit according to claim 17 wherein said combining circuit means comprises a comparator which provides said output signal when said first signal has a magnitude which exceeds the magnitude of said second signal by a predetermined amount.

19. A protection circuit according to claim 18 which includes short circuit protection means coupled to said FET current for providing a short circuit control signal to said driver excitation circuit means for reducing the FET current when FET current exceeds some predetermined threshold.

20. A protection circuit according to claim 19 which includes start up circuit means coupled to said drive excitation circuit means for providing a start up signal for preventing said output signal from reducing said FET current for a predetermined time after the FET is initially turned on by a control signal received by said drive excitation circuit means.

21. A transistor overtemperature protection circuit comprising:

a transistor having a least a control electrode and two separate main current conduction electrodes the current therethrough dependent on signals at said control electrode, one of the current conduction electrodes intended for connection to a load so that the transistor can selectively control current supplied to the load;

drive excitation circuit means for providing excitation to the transistor to selectively control conduction of the transistor in accordance with received control signals;

first circuit means coupled to the transistor for developing a first signal indicative of and varying in accordance with the voltage between the transistor current conduction electrodes;

second circuit means coupled to the transistor for developing a second signal indicative of and varying in accordance with current flowing through one of said current conduction electrodes when said transistor is on;

combining circuit means coupled to the first and second circuit means for receiving the first and second signals and combining them to provide an output signal in response thereto when a predetermined relationship exists between the first and second signals indicative of transistor on resistance between said current conduction electrodes exceeding a predetermined value; and coupling means for providing said output signal as at least one of the control input signals received by said drive excitation circuit means, said drive excitation means including means for responding to said output signal by reducing said transistor current through said current conduction electrodes when said predetermined relationship exists.

* * * * *

UNITED STATES PATENT AND TRADEMARK OFFICE
CERTIFICATE OF CORRECTION

PATENT NO. : 4,896,245
DATED : Jan. 23, 1990
INVENTOR(S) : John Qualich

It is certified that error appears in the above-identified patent and that said Letters Patent is hereby corrected as shown below:

Title page:

In the Abstract

Line 6 "whe" should be --when--

Line 9 "due" should be --die--

Line 13 "it" should be --if--

Signed and Sealed this

Eighth Day of January, 1991

Attest:

Attesting Officer

HARRY F. MANBECK, JR.

Commissioner of Patents and Trademarks